United States Patent [19]

Krenik

[11] Patent Number: 4,818,897

[45] Date of Patent: Apr. 4, 1989

[54] FAST ONE WAY AMPLIFIER STAGE

[75] Inventor: William R. Krenik, Dallas, Tex.

[73] Assignee: Texas Instruments Incorporated, Dallas, Tex.

[21] Appl. No.: 101,108

[22] Filed: Sep. 25, 1987

[51] Int. Cl.⁴ .................... H03K 5/24; H03K 5/153
[52] U.S. Cl. .................... 307/362; 307/263; 307/490; 330/253
[58] Field of Search ............ 307/263, 350, 360, 362, 307/490; 330/252, 253, 257; 331/108 C, 108 A, 113 R, 144

[56] References Cited

U.S. PATENT DOCUMENTS

| | | | |
|---|---|---|---|
| 4,358,689 | 11/1982 | Jarrett et al. | 307/360 |
| 4,383,223 | 5/1983 | Ulmer | 330/253 |
| 4,453,092 | 6/1984 | Joseph | 307/362 |
| 4,661,779 | 4/1987 | Okamoto | 330/253 |
| 4,677,321 | 6/1987 | Bacrania | 307/362 |

Primary Examiner—John Zazworsky
Attorney, Agent, or Firm—Thomas R. FitzGerald; Leo N. Heiting; Melvin Sharp

[57] ABSTRACT

A fast one way amplifier/comparator stage includes a transconductance square law device (20) for receiving an input voltage and a reference voltage and outputting a current that varies as the square law of the voltage difference. This current is converted to a voltage in a transresistance device (26) for controlling the switch element (30). The switch element (30) is operable to switch a capacitive load to either a positive rail or to a negative rail at a fast slew rate. The amplifier/comparator stage only draws current when the switch element (30) is conducting. When the switch element (30) is nonconducting, a load transistor (38) pulls the load (36) to the opposite terminal from that to which the switch element (30) is connected.

25 Claims, 3 Drawing Sheets

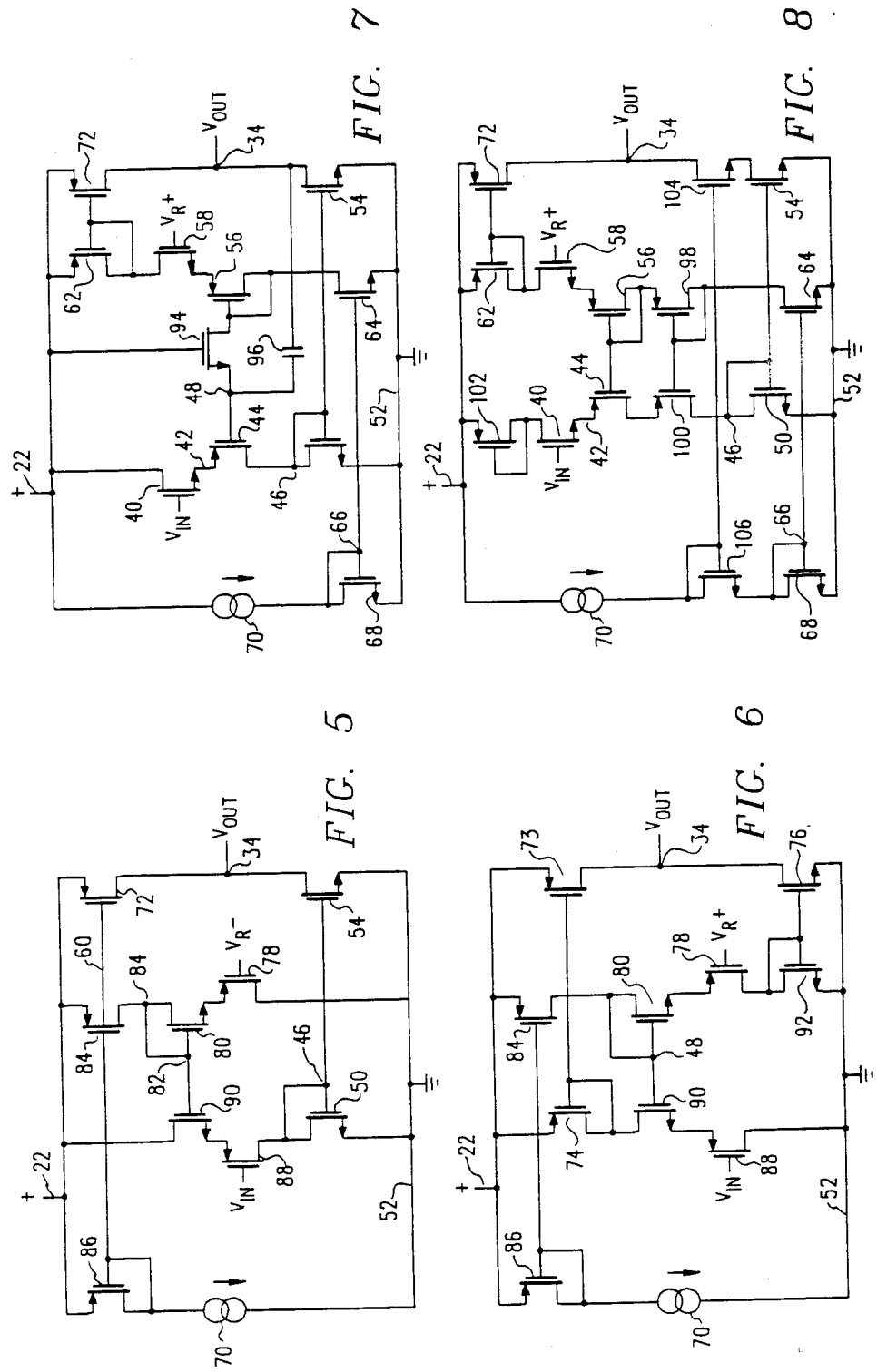

4,818,897

FAST ONE WAY AMPLIFIER STAGE

TECHNICAL FIELD OF THE INVENTION

The present invention pertains in general to high slew rate amplifiers, and more particularly, to a fast one way amplifier having a fast slew rate in one direction with minimal power consumption.

BACKGROUND OF THE INVENTION

There are a number of applications which require an amplifier/comparator that has a fast slew rate in one direction from a positive to a negative voltage or in the opposite direction from a negative to a positive voltage. Typically, amplifiers of this type are combined as two separate amplifier/comparator stages, the first one providing a positive transition and the second providing a negative transition. The outputs of the two amplifiers are then combined with a circuit such as a set/reset flip-flop, with the output waveform transitions having slew rates determined by either the first or second amplifier/comparator stage.

One previous type of amplifier/comparator stage for providing a fast slew rate in one direction only utilizes a full Class A type comparator. In this device, a differential MOS device is provided having two separate legs, each for receiving a separate polarity of a differential input voltage, with a common current source providing current to both legs. The lower ends of each of the legs are coupled through a current mirror configuration, with the output of one leg driving the gate of a switching element. Depending upon the state of the differential input, one leg is always drawing current. This current is utilized during switching between two differential states to charge the associated node capacitance of the current mirror configuration. Therefore, in either state the current must be sufficient to charge this capacitor. When this differential configuration is utilized in a one way amplifier/comparator, the differential configuration drives an output switch element. The switch element has an active state with the switch element conducting and an inactive state with the switch element non-conducting. The current for the differential configuration driving the switch element is the same for either the active or the inactive state, resulting in a large power requirement for the device when the switch element is not actually conducting, i.e., when it is not in the fast slewing mode. This presents a disadvantage to the design of low power, high speed devices. There therefore exists a need for a low power fast one way amplifier/comparator.

SUMMARY OF THE INVENTION

The present invention disclosed and claimed herein comprises a fast one way comparator/amplifier. The amplifier/comparator includes a transconductance square law device which receives on two inputs an input voltage and a reference voltage, respectively. The square law device generates a current that varies as the square law of the difference voltage between the input and reference voltages for one polarity thereof and inhibits current for the opposite polarity. The current is input to a transresistance device to generate a voltage for controlling a transconductance switch element. The transconductance switch element has a low source impedance and is connected between an output terminal which has a capacitive load associated therewith and either a positive supply rail or a negative supply rail. The switch element is operable to connect the output terminal to the associated positive or negative rail when the voltage output by the transresistance device exceeds a predetermined threshold voltage. A load device is provided that is connected between the output terminal and the other of the positive or negative rails such that the output terminal is disposed at the other of the positive or negative rails when the switch element is non-conducting.

In one embodiment of the present invention, the transconductance square law device is comprised of an N-channel and a P-channel transistor which have the source electrodes thereof tied together. For one polarity of operation, the input voltage is connected to the gate of the N-channel transistor and a reference voltage is connected to the input of the P-channel transistor. For the opposite polarity of operation, the input voltage is connected to the gate of the P-channel transistor and the reference voltage is connected to the gate of the N-channel transistor. The transresistance device is comprised of a series connected MOS transistor having the drain and gate thereof connected together and to the transconductance device.

In another embodiment of the present invention, the reference voltage input to the transresistance device is bootstrapped by the output voltage such that a hard drive is obtained when the output voltage varies for a small variation between the input and reference voltages. The bootstrapping is comprised of a capacitor connected between the input to the transconductance device and the output terminal.

In yet another embodiment of the present invention, the output switching element is comprised of an MOS transistor having a gate and a source-to-drain path. The gate of the transistor is connected to the voltage output by the transresistance device such that the MOS switching transistor is conductive when the gate voltage exceeds one threshold voltage across the gate-to-source of the transistor. A series transistor is provided in series with the source-to-drain path of the switching transistor to form a Cascode arrangement.

A technical advantage is provided by the present invention in that the transconductance element has a square law characteristic that is not limited by a series current source. This provides improved large signal performance. Standby current is required only for the generation of the reference voltage with current provided by the transconductance element charging the gate-to-source capacitance of the switching transistor. This provides a fast slew rate for one direction of voltage change on the output terminal. A further technical advantage is provided by the present invention in that the common-mode range of the one way amplifier/comparator is to a respective one of the positive or negative rails. This therefore allows a common-mode range to one rail with voltage slewing to one rail wherein current is only drawn for one output state.

BRIEF DESCRIPTION OF THE DRAWINGS

For a more complete understanding of the present invention and the advantages thereof, reference is now made to the following description taken in conjunction with the accompanying Drawings in which:

FIG. 5 illustrates a non-inverting configuration of the amplifier/comparator stage with common-mode range the negative supply rail and fast slewing to the negative rail;

FIG. 6 illustrates an inverting configuration of the amplifier/comparator stage with common-mode range to the negative supply rail and fast slewing to the positive rail;

FIG. 7 illustrates a schematic diagram of the amplifier/comparator utilizing AC coupled positive feedback for increased slew rates;

FIG. 8 illustrates the amplifier/comparator utilizing dummy devices and cascode devices for improved input offset performance;

DETAILED DESCRIPTION OF THE INVENTION

Figure 1:
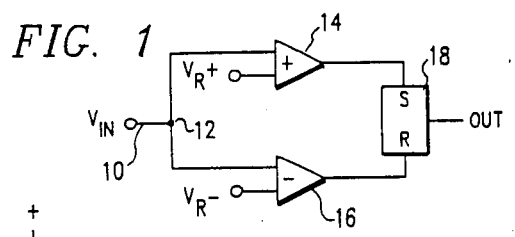
FIG. 1 illustrates a schematic block diagram of one application of the one way amplifier/comparator stage of the present invention.

Referring now to FIG. 1 there is illustrated a schematic diagram of one application of the fast one way amplifier of the present invention. In FIG. 1, an input voltage is input on a line 10 to a node 12. The node 12 is connected to one input of a positive one way amplifier/comparator stage 14 and also to one input of a negative one way amplifier/comparator stage 16. The input of the amplifier/comparator stage 14 is connected to a positive reference voltage and the other input of the negative amplifier/comparator stage 16 is connected to a negative reference voltage. The output of the positive amplifier/comparator stage 14 is input to the set input of a set-reset flip flop 18 and the output of the negative amplifier/comparator stage 16 is input to the reset input of the flip flop 18.

In operation, when the input voltage on line 10 goes above the positive reference voltage, the output of the amplifier/comparator stage 14 goes negative, and, in a similar manner, when the input voltage goes below the negative reference voltage, the output of amplifier/comparator stage 16 goes negative. Each of the amplifier/comparator stages 14 and 16 operate in the same directions at a fast slew rate. Therefore, the output voltage has the rising edge controlled by the amplifier/comparator stage 14 and the trailing edge controlled by the amplifier/comparator stage 16. This diagram is a conventional circuit which is used in such circuits as a "555" timer. In addition, there are numerous other uses for a fast one way amplifier/comparator stage.

Primarily, the amplifier/comparator stages operate in a class AB mode which requires that the amplifier/comparator stages operate in a large signal mode. However, due to the operation of the two one way amplifier/comparator stages 14 and 16, it is only necessary for the positive amplifier/comparator stage 14 to operate when the input voltage goes above the positive reference voltage and for the negative amplifier/comparator stage 16 to operate when the input voltage goes below the negative reference voltage. In prior art devices, current is continually drawn through both of the amplifier/comparator stages, thus resulting in an excessive power drain. As will be described hereinbelow, the amplifier/comparator stage of the present invention operates with a lower power drain, in addition to providing improved large signal characteristics.

Figure 2:
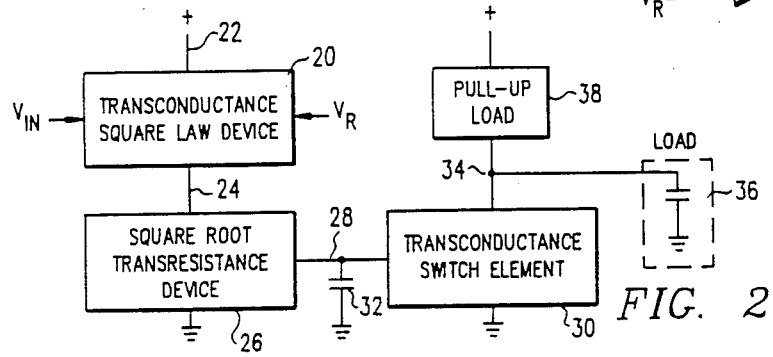
FIG. 2 illustrates a schematic diagram of a one way amplifier/comparator stage of the present invention.

Referring now to FIG. 2, there is illustrated a schematic diagram of a fast one way amplifier/comparator with fast slewing to the negative rail. A precision reference voltage $V_R$ is input to one input of a transconductance square law device 20 which has the other input thereof connected to an input voltage $V_{IN}$. The square law device 20 is operable to receive current from a positive voltage terminal 22 for output on a negative terminal 24. The current is controlled by the square law device 20 in accordance with a square law relationship wherein the current varies as a square of the differential voltage between $V_{IN}$ and $V_R$. The negative terminal 24 is connected to the input of a square root transresistance device 26. The square root transresistance device is operable to generate a voltage which is equal to the square root of the current generated by the transconductive square law device 20. This voltage is output on a node 28.

The voltage on node 28 is connected to the input of a transconductance square law switch element 30 with the node 28 having a parasitic capacitance 32 associated therewith. The transconductance switch element is operable to switch a node 34 to ground when the switch element 30 is activated. Node 34 is connected to a capacitive load 36 with the switch element 30 operable to discharge the capacitive load 36. The discharge of the capacitive load 36 provides the fast negative slew rate. When switch element 30 is inactive or turned off, a pull-up load 38 is provided for connecting the node 34 to the positive supply. However, it should be noted that the pull-up load 38 does not necessarily provide a fast transition relative to the negative rail.

In operation, when $V_{IN}$ exceeds $V_R$, current is sourced to the transresistance device 26 on the negative terminal 24. This results in a voltage being output on line 28 which both charges the parasitic capacitor 32 and turns on the switch element 30. This parasitic capacitor 32 provides some delay which must be overcome by the current sourced by the square law device 20. When the voltage $V_{IN}$ is below $V_R$, no current is sourced by the square law device 20.

Figure 3:
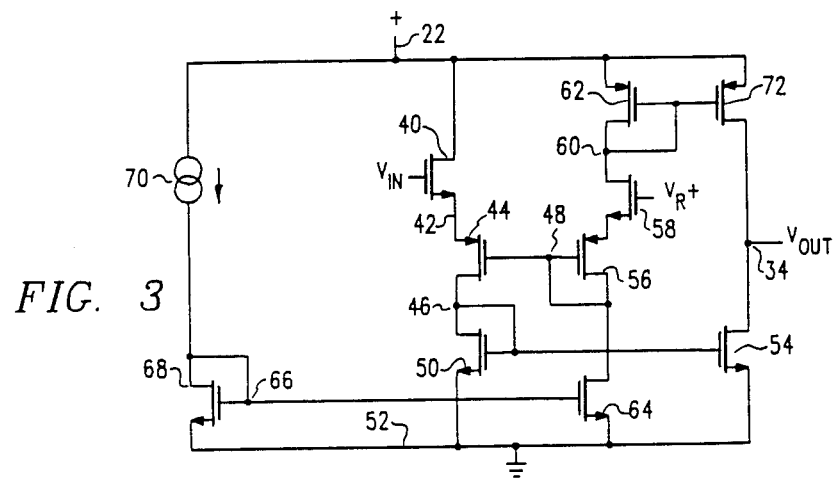
FIG. 3 illustrates a schematic diagram of an inverting configuration of the amplifier/comparator stage with a common-mode range to the positive supply rail and fast slewing to the negative rail.

Referring now to FIG. 3, there is illustrated a schematic diagram of an inverting amplifier/comparator stage with common-mode range to the positive supply rail and fast slewing to the negative rail. An N-channel MOS transistor 40 has the drain thereof connected to the positive voltage terminal 22, the source thereof connected to a node 42 and the gate thereof connected to a voltage $V_{IN}$. A P-channel MOS transistor 44 has the source thereof connected to the node 42, the drain thereof connected to a node 46 and the gate thereof connected to a node 48. The transistor 40 and the transistor 44 comprise the square law device 20 of FIG. 2. An N-channel transistor 50 has the source thereof connected to a ground terminal 52, and both the drain and gate thereof connected to node 46. Transistor 50 comprises the square root transresistance device 26 of FIG. 2. The node 46 is connected to the gate of an N-channel transistor 54 which has the drain thereof connected to the node 34 and the source thereof connected to the ground terminal 52, the transistor 54 comprising the transconductance switch 30 of FIG. 2. The transistors 50 and 54 form a current mirror with the current drawn through transistor 54 being a function of the relative sizing between the devices 54 and 50 which, for MOS devices, is the W/L ratio.

The node 48 that is connected to the gate of transistor 44 comprises a precision reference voltage which corresponds to the voltage $V_R$ input to the square law device 20 of FIG. 2. A P-channel transistor 56 has the gate and drain thereof connected to node 48 and the source thereof connected to the source of an N-channel transistor 58. Transistor 58 has the gate thereof connected to a reference voltage $V_R+$ and the drain thereof connected to a node 60. A P-channel transistor 62 has the gate and drain thereof connected together and connected to node 60, and the source thereof connected to positive voltage terminal 22. An N-channel transistor 64 has the drain thereof connected to node 48, the source thereof connected to the ground terminal 52 and the gate thereof connected to a node 66. Transistors 56, 58, 62 and 64 comprise a reference leg for generating a reference voltage at the node 48. The reference leg draws a small amount of bias current, with the voltage on node 48 being equal to the reference voltage $V_R+$ minus two threshold voltages ($V_T$). The current to the reference leg is determined by a current mirror configuration which utilizes as one leg the transistor 64 and as the other leg an N-channel transistor 68, transistor 68 having the source thereof connected to the ground terminal 52 and the gate and drain thereof connected together and connected to node 66 and also to one end of a current source 70. Current source 70 sources current from the positive terminal 22 to the drain of transistor 68. The W/L ratio of transistors 64 and 68 determines the amount of current drawn through the reference leg.

The transistor 62 is operable to mirror current over to a P-channel transistor 72 which is in the output leg of the amplifier/comparator. Transistor 72 has the source thereof connected to the positive voltage terminal 22, the gate thereof connected to the gate of transistor 62 and the drain thereof connected to the output node 34. Transistor 72 functions as a pull-up load which is equivalent to the pull-up load 38 of FIG. 2.

In operation, when $V_{IN}$ is below $V_R+$, transistors 40 and 44 are turned off in addition to transistor 50 being turned off. When transistor 50 is turned off, no voltage is applied to the gate of transistor 54, which results in transistor 54 being turned off. In this mode, node 34 is pulled high through transistor 72. However, transistor 72 is a relatively high resistance device and does not pull the node 34 up at a fast rate. Rather, it merely charges the capacitive load 36 associated with node 34 to a high voltage level. When $V_{IN}$ is disposed at a voltage above $V_R+$, transistors 40 and 44 begin to conduct since $V_{IN}$ is greater than $2V_T$ above the voltage on node 48. The relationship between the voltage $V_{IN}$ and the voltage on node 48, and the current through transistors 40 and 44, is a square law relationship. That is, the current through transistors 40 and 44 varies as the square law of the differential voltage between $V_{IN}$ and the voltage on the node 48. This current is input to node 46 and through transistor 50. The voltage on node 46 varies as the square root of the current through transistor 50. Initially, the current drawn through transistors 40 and 44 charges the gate-to-source capacitance of transistor 54 and the associated capacitance on node 46. This is thus referred to as the "charging current." The gate-to-source capacitance is a function of the size of the transistor 50 and 54. When the gate-to-source capacitance of transistor 54 has been charged up to a level that exceeds the $V_T$ of transistor 54, current is drawn from node 34 and the associated capacitor in load 36 to discharge the capacitor. The rate of discharge depends upon the size of transistor 54 and the rate at which the gate-to-source capacitance of transistor 54 can be charged.

In an important aspect of the present invention, it can be seen that when $V_{IN}$ is below $V_R+$, no current is being drawn through transistors 40 and 44, and only a small amount of bias current is being drawn through the reference leg comprised of transistors 56, 58, 62 and 64. Current is only drawn through transistors 40 and 44 when $V_{IN}$ is above $V_R+$, which is the condition for activation of the one way amplifier/comparator stage of FIG. 3. Further, it can be seen that no current source is disposed in series with transistor 40 such that for a large differential voltage between $V_{IN}$ and the voltage on node 48, the square law relationship between the current and the differential voltage will be maintained. Additionally, the amplifier/comparator stage of FIG. 3 is operable to detect the difference between the voltage $V_{IN}$ and $V_R+$ even when the common mode voltage therebetween is equal to the voltage of the positive voltage terminal 22; that is, the common-mode range extends to the positive supply rail. For example, if the voltage of $V_R+$ were equal to the voltage on the positive voltage terminal 22, an increase in the voltage $V_{IN}$ above that voltage would be detected and would result in transistor 54 turning on.

Figure 4:
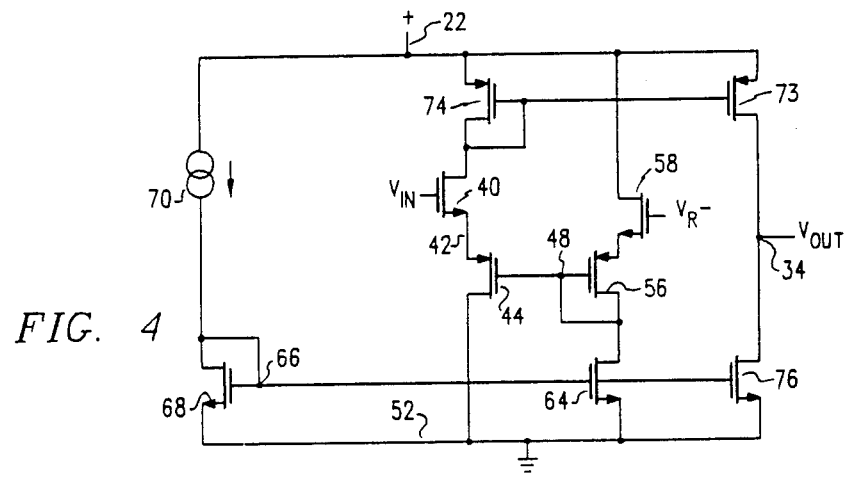
FIG. 4 illustrates a non-inverting configuration of the amplifier/comparator stage with common-mode range to the positive supply rail and fast slewing the positive rail.

Referring now to FIG. 4, there is illustrated a non-inverting configuration of an amplifier/comparator stage with a common-mode range to the positive supply rail and fast slewing to the positive rail, wherein like numerals refer to like parts in the various figures. It should be understood that this is a parallel operation to the circuit of FIG. 3. The reference voltage is generated at the node 48 with transistors 58, 56 and 64 providing the reference leg with a negative reference voltage $V_R-$ connected to the gate of the transistor 58. The transconductive square law device is fabricated with transistors 40 and 44, with these transistors determining the current therethrough as a function of the difference between the voltage $V_{IN}$ and the voltage $V_R-$. However, the output terminal 34 is connected to the positive voltage terminal 22 through a P-channel transistor 73 which is similar in size and operation to the transistor 54 of FIG. 3. Transistor 73 is operable to charge the capacitive load 36 at a fast rate, resulting in a fast slew rate to the positive rail. Transistor 73 has the gate thereof connected to the gate of a P-channel transistor 74, transistor 74 having the source thereof 10 connected to the positive voltage terminal 22 and the gate and drain thereof connected together and to the drain of transistor 40, such that it is in series therewith. Transistor 74 is similar to transistor 50 and is operable to provide the function of the transresistance device 26 of FIG. 2. There is a gate-to-source capacitance associated with transistor 73, which is similar to the parasitic capacitance 32 of FIG. 2. An N-channel transistor 76 is provided as a pull down device and has the drain thereof connected to the output node 34, the source thereof connected to the ground terminal 52 and the gate thereof connected to the gate of transistor 64, transistor 76 functioning similar to device 72 of FIG. 3 with the exception that it discharges the capacitor and operates as a pull down load.

The circuit of FIG. 4 is similar in operation to the circuit of FIG. 3 in that the slewing transistor 73 operates when the voltage $V_{IN}$ exceeds the voltage $V_R-$ with the exception that the output slews to the positive rail, thus creating a non-inverting amplifier/comparator stage. The amplifier/comparator stage of FIG. 4 has a common-mode range to the positive supply rail.

Referring now to FIG. 5, there is illustrated a schematic diagram of a non-inverting amplifier/comparator stage with a common-mode range to the negative supply rail and fast slewing to the negative rail, wherein like numerals refer to like parts in the various figures. The reference leg of the amplifier/comparator stage of FIG. 5 is formed from a P-channel transistor 78 having the drain thereof connected to ground terminal 52, the gate thereof connected to the reference voltage $V_R-$ and the source thereof connected to the source of a second P-channel transistor 80. Transistor 80 has the gate and source thereof tied together and to a node 82 and also to the drain of transistor 84. Transistor 84 has the gate thereof connected to the node 60 and the source thereof connected to the positive supply terminal 22. Transistor 84 is mirrored to the load transistor 72 in the output leg. Additionally, transistor 84 is mirrored from the current source 70 through a P-channel transistor 86, transistor 86 having the source thereof connected to the positive supply terminal 22 and the gate and drain thereof tied together and connected to node 60 and also to the top of current source 70, current source 70 having the bottom end thereof connected to the ground terminal 52. The reference leg is operable to generate a voltage on node 82 that is $2V_T$ above the reference voltage $V_R-$.

The transconductance square law device 20 is realized with a first P-channel transistor 88 which has the gate thereof connected to the voltage $V_{IN}$, the source thereof connected to the source of an N-channel transistor 90 and the drain thereof connected to the node 46. The gate of transistor 90 is connected to node 82 and the drain thereof is connected to the positive supply terminal 22.

In operation, when the voltage $V_{IN}$ falls below $V_R-$, transistors 88 and 90 begin to conduct and current flows through transistor 50. This charges up the parasitic gate-to-source capacitance of transistor 54, pulling node 34 to ground and discharging capacitive load 36. When $V_{IN}$ is disposed at a voltage above $V_R-$, transistors 88 and 90 are turned off and transistor 54 is turned off. Transistor 72 pulls node 34 high. However, the fast slew rate is realized through transistor 54 in the negative direction toward the negative rail. With respect to the common-mode range, the circuit of FIG. 5 is operable to allow the voltage $V_R-$ to be disposed as low as the voltage on the negative terminal 52 at the negative rail, and any difference between the voltage $V_{IN}$ and $V_R-$ is detected and the transistor 54 gated in accordance therewith.

Referring now to FIG. 6, there is illustrated a schematic diagram of an inverting amplifier/comparator stage with a common-mode range to the negative supply rail and fast slewing to the positive rail, wherein like numerals refer to like parts in the various figures. The output leg with transistors 73 and 76 is configured similar to the circuit of FIG. 4, in that the P-channel transistor 73 connected between the output node 34 and the positive supply terminal 22 comprises the slewing transistor to provide a fast slew rate to the positive rail. The N-channel transistor 76 is a load transistor that has a relatively high output resistance.

In the reference leg, transistor 78 and transistor 80 are configured similar to transistors 78 and 80 in FIG. 5 with the voltage reference $V_R+$ connected to the gate of the transistor 78. Similarly, the transconductance square law device 20 is configured with the transistors 88 and 90, with the drain of the transistor 88 connected to the ground terminal 52 and the drain of the transistor 90 being connected to the drain and gate of the transistor 74. As described above with respect to FIG. 4, transistor 74 is operable as the square root transresistance device 26 of FIG. 2. It effectively mirrors current to the slewing transistor 73 and also allows charging of the gate-to-source capacitance of the slewing transistor 73 through transistors 88 and 90. The load transistor 76 is mirrored to an N-channel transistor 92 which has the gate and drain thereof connected to both the gate of transistor 76 and also to the drain of transistor 78, and the source thereof connected to the ground terminal 52.

In operation, when the voltage $V_{IN}$ is disposed at a voltage more negative than $V_R+$, the current flows through the transconductance square law device to charge up the gate-to-source capacitance of transistor 73 and turn on transistor 72 to pull node 34 to the positive supply terminal 22 and charge the capacitive load 36 to a high level. When the voltage $V_{IN}$ is above $V_R+$, transistor 73 is turned off and load transistor 76 pulls load 34 low with the current through transistor 76 determined by the W/L ratio between transistor 76 and transistor 92. As described above with respect to FIG. 5, the common-mode range is to the negative rail.

Referring now to FIG. 7, there is illustrated a schematic diagram of an alternate embodiment of the circuit of FIG. 3, wherein like numerals refer to like parts in the various figures. The circuit of FIG. 3 has an N-channel transistor 94 disposed between the node 48 and the gate of transistor 56, with the source of transistor 94 connected to the node 48 and the drain thereof connected to the gate of transistor 56. The gate of transistor 94 is connected to the positive supply terminal 22. Node 48 is also connected through a capacitor 96 to the output node 34. The circuit of FIG. 7 provides an AC coupled positive feedback for increasing slew rate.

In operation, transistor 94 essentially provides a large resistance between the node 48 and the gate of transistor 56. Capacitor 96 has the plate associated with node 34 disposed at the supply voltage 22 when transistor 54 is non-conducting, and the other plate thereof connected to node 48, which is disposed at a voltage $2V_T$ below the voltage $V_R+$. When transistor 54 is initially turned on, the voltage from node 34 is pulled down, which boots node 48 downward to provide a harder drive to transistor 50. This effectively increases the conductance of transistor 54, thus increasing the slew rate. It should be understood that this booting capacitor 96 can be utilized with any of the above inverting circuits. For the non-inverting circuits, it is necessary to provide an inverting function between the bootstrapping capacitor and the intermediate reference voltage input to the transconductance square law device 20. In this manner, slewing to the negative terminal will cause the intermediate voltage to rise, or it will be booted positive. For slewing to the positive terminal, the intermediate voltage will be booted negative. For example, a CMOS inverter could be utilized.

Referring now to FIG. 8, there is illustrated an alternate embodiment of the circuit of FIG. 3 utilizing dummy devices and cascode devices to improve input offset performance, wherein like numerals refer to like parts. A P-channel transistor 98 is connected in series between the drain of transistor 56 and the drain of transistor 64. Transistor 98 has the gate and drain thereof connected to the gate of a second P-channel transistor 100 with transistor 100 being connected between transistors 50 and 44. The source of transistor 100 is connected to the drain of transistor 44 and the drain of transistor 100 is connected to the drain of transistor 46. Transistors 98 and 100 provide a better match between the gate-to-drain voltage of transistor 56 and the gate-to-drain voltage of transistor 44. A dummy P-channel transistor 102 is disposed in series between the drain of transistor 40 and the positive supply terminal 22, with the source thereof connected to the positive supply terminal 22 and the gate and drain thereof connected together and to the drain of transistor 40. P-channel device 102 balances the source-to-drain voltage of transistors 40 and 58.

An N-channel transistor 104 is connected in series between the drain of slewing transistor 54 and the output node 34, with the source of transistor 104 connected to the drain of transistor 54, the drain thereof connected to node 34 and the gate thereof connected to the gate of an N-channel transistor 106. Transistor 106 has the gate and drain connected together to the low end of the current source 70 and the source thereof connected to the drain of transistor 68 at the node 66. Transistors 104 and 54 operate in a cascode configuration and are operable to eliminate the Miller effect on the gate-to-drain capacitance of transistor 54. It should be understood that the dummy devices utilized in the circuit of FIG. 8 can be utilized with any of the circuits described above with respect to FIGS. 3-7.

Figure 9:
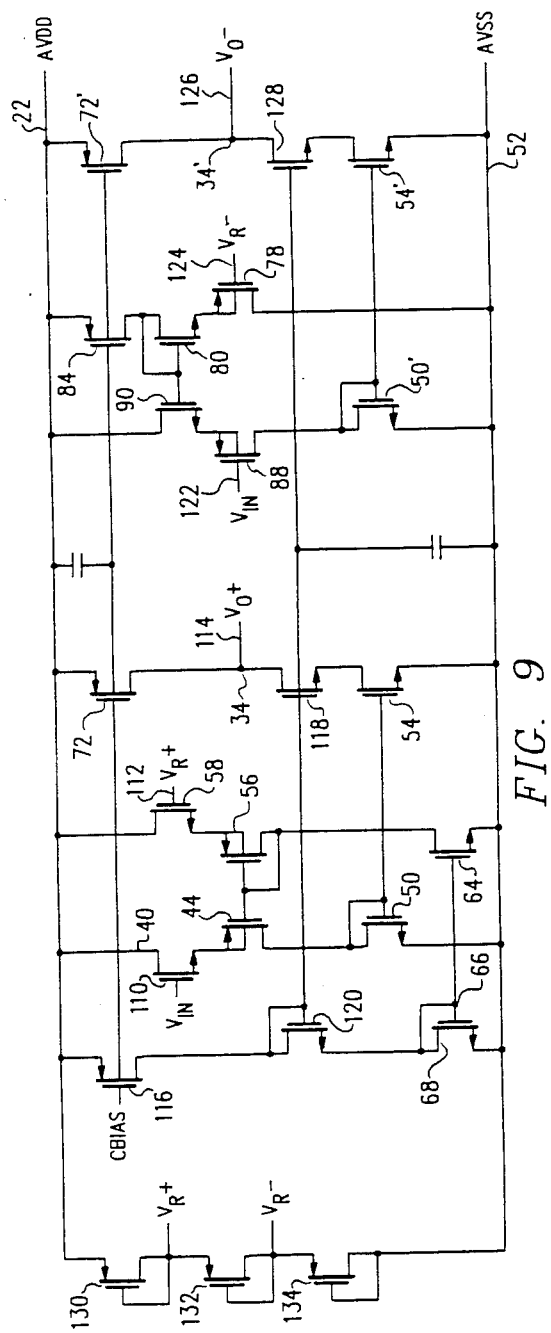
FIG. 9 illustrates a schematic diagram of one application of the one way amplifier/comparator stage utilizing common mode range to both the positive and negative rail, and fast slewing to the negative rail.

Referring now to FIG. 9, there is illustrated an example of a bistable multivibrator or oscillator utilizing the one way fast amplifier/comparator stages of the present invention. The circuit of FIG. 9 is comprised of two fast one way amplifier/comparator stages, a positive stage and a negative stage. The positive stage receives an input voltage $V_{IN}$ on a terminal 110 for comparison with a reference voltage $V_R+$ on a terminal 112 to provide the function of the circuit of FIG. 3 as an inverting stage with common-mode range to the positive supply rail and fast slewing to the negative rail. The output voltage is $V_O+$ on a terminal 114. The circuitry for the positive amplifier/comparator is similar to the circuit of FIG. 3, wherein like numerals refer to like parts in the two figures. The P-channel load transistor 72 is mirrored with a P-channel transistor 116 such that the gate of transistor 72 is connected to the gate of transistor 116, which gate is connected to a voltage CBIAS. The transistor 116 is operable to provide the function of the current source 70 in FIGS. 3-8, with the source thereof connected to the positive supply terminal 22 and the drain thereof operably to source current.

The positive stage utilizes a cascode arrangement in the output link, as described above with reference to FIG. 8. This is realized with an N-channel transistor 118 connected in series with the slewing transistor 54, similar to the configuration of transistor 104 in FIG. 8. The transistor 118 is mirrored with an N-channel transistor 120 connected in series between the drain of transistor 116 and the drain of transistor 68, with the source of transistor 120 connected to the drain of transistor 68 and the drain and gate of transistor 120 connected to the drain of transistor 116. Transistor 120 operates similar to transistor 106 in FIG. 8.

The negative stage receives the input voltage $V_{IN}$ on a terminal 122 and voltage reference $V_R-$ on a terminal 124, and outputs a voltage $V_O-$ on a terminal 126. The negative stage is a non-inverting stage with common-mode range to the negative supply rail and fast slewing to the negative rail and is similar to the configuration of FIG. 5, wherein like numerals refer to like parts in the two figures with any common components between the positive stage and the negative stage represented by a primed reference numeral. These common components are the N-channel transistor 50', the node 46', the N-channel slewing transistor 54' and the load transistor 72'. The cascode arrangement is also utilized in the output leg in accordance with the embodiment of FIG. 8 wherein an N-channel transistor 128 is disposed between the output terminal 126 and the drain of the slewing transistor 54'. The gate of transistor 128 is connected to the gate of the transistor 120 in the current source leg with the drain thereof connected to the output terminal 126 and the source thereof connected to the drain of slewing transistor 54'.

The reference voltages $V_R$ and $V_R-$ are derived from a separate reference leg. Three P-channel transistors, 130, 132 and 134 are connected in series between the positive supply terminal 22 and the ground terminal 52 with each of the P-channel transistors 130–134 having the gates thereof connected to the drain thereof. The first P-channel transistor 130 is connected between the positive supply terminal 22 and the source of P-channel transistor 132 to provide the $V_R+$ reference voltage. The second P-channel transistor 132 is connected between $V_R+$ and the source of P-channel transistor 134 to provide the reference voltage $V_R-$ with the third P-channel transistor connected between $V_R-$ and the ground terminal 52.

Figure 10:
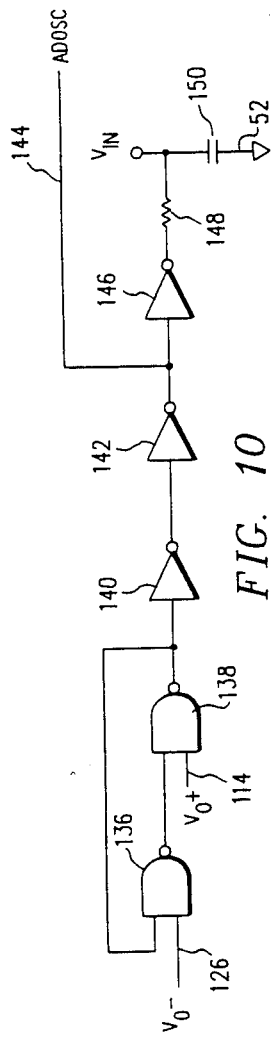
FIG. 10 illustrates the output logic for interfacing with the amplifier/comparator stages of FIG. 9.

Referring now to FIG. 10, there is illustrated a logic diagram of the logic circuit for receiving the output voltages $V_O$ and $V_O-$ and generating the voltage $V_{IN}$ in a feedback configuration to provide an oscillator. A set-reset latch is realized utilizing a NAND gate 136 which has the output thereof connected to one input of a NAND gate 138 with one input of NAND gate 136 connected to the output of NAND gate 138. The other input of NAND gate 136 is connected to the output voltage $V_O-$ on terminal 126 and the other input of NAND gate 138 is connected to the voltage $V_O+$ on output terminal 114. The output of NAND gate 138 is passed through two series connected inverters 140 and 142 to provide the oscillator output on a terminal 144. The output of inverter 142 is passed through an inverter 146 to one side of a series resistor 148. The other side of the series resistor 148 provides the voltage $V_{IN}$ for connection to terminals 110 and 122. The other side of resistor 148 is also connected to one side of a capacitor 150 which has the other side thereof connected to the ground terminal 52. The resistor 148 and the capacitor 150 provides the timing elements of the oscillator.

In operation, the voltage $V_{IN}$ on the output of resistor 148 varies between a voltage slightly less than $V_R-$ to a voltage slightly more than $V_R+$. When the voltage $V_{IN}$ is less than $V_R+$ and greater than $V_R-$, the output voltage $V_O+$ or $V_O-$ on output terminals 114 or 126, respectively, are pulled high through load transistor 72 and 72', respectively. During this time, only the standby current required to power the current sources and the reference legs is being drawn. This results in a significant current saving. When the voltage $V_{IN}$ goes slightly above the voltage $V_{R+}$, transistors 40 and 44 in the positive amplifier/comparator stage conduct, turning on transistor 54 and pulling voltage $V_{O+}$ on terminal 114 low. This forces the output of NAND gate 138 high, resulting in a high level on the output of inverter 142 on output terminal 144. However, inverter 146 pulls one side of resistor 148 low, thus pulling the voltage $V_{IN}$ low in accordance with the RC time constant of resistor 148 and capacitor 150. When the voltage $V_{IN}$ goes below $V_{R+}$, the transistors 40 and 44 turn off to allow $V_O$ to go back to a high voltage. During this time, no current is being conducted through transistors 40 and 44 or through transistors 88 and 90 in the negative stage.

When the voltage $V_{IN}$ goes to a point below the voltage $V_{R-}$, transistors 88 and 90 turn on to subsequently turn on slewing transistor 54′ to pull the voltage $V_{O-}$ on output terminal 126 low. This forces the output voltage on NAND gate 138 to a logic low which raises the voltage on the input to resistor 148 high. This provides the oscillator function, which has a fast slew rate on both the positive and negative going edges and also utilizes very little power. In addition, it can be seen that the common-mode range on the positive stage is to the positive rail an the common-mode range on the negative stage is to the negative rail, thus providing a rail to rail common-mode range in addition to decreased power consumption.

In summary, there has been provided a fast one way amplifier/comparator stage which provides a common-mode range to one of two rails with a fast slewing rate to one of two rails. The amplifier/comparator stage utilizes a square law device for sampling the differential voltage between a reference voltage and an input voltage, and generating a current in accordance with the square law relationship. This current is converted to a voltage in accordance with a square root transresistance device, which voltage is utilized to control a square law switch element. This switch element is operable to discharge or charge a capacitive load at a fast slew rate. The charging current required to switch the switching element is only drawn when the device is pulled to the respective one of the positive or negative rails, depending upon which rail the switching element is connected to. A load device is provided for pulling the load to the opposite rail when the switching element is inactive or non-conducting.

Although the present invention has been disclosed and claimed, it should be understood that various changes, substitutions and alterations can be made therein without departing from the spirit and scope of the invention as defined by the appended claims.

What is claimed is:

1. A one way amplifier/comparator, comprising:
a positive rail disposed at a positive voltage;
a negative rail disposed at a negative voltage;
an output node having a capacitive load associated therewith;
an input terminal for receiving an input voltage;
a reference terminal for receiving a reference voltage;
amplifier/comparator circuitry for interfacing with said input and reference terminals to determine the voltage difference therebetween and sourcing a current from said positive rail to said negative rail that varies in a square law relationship with said voltage difference for one polarity thereof and inhibits current flow for the opposite polarity thereof;
switch circuitry having an active state with a low source impedance and an inactive and non-conducting state for selectively switching said output node to one of said positive or negative rails when in the active state;
switch control circuitry coupled in series with said amplifier/comparator circuitry for sensing said current having said square law relationship with said voltage difference of said one polarity and for controlling said switch circuitry to switch from the inactive state to the active state when said current sourced by said amplifier/comparator circuitry exceeds a predetermined level; and
load circuitry for pulling said output node to the opposite of the one of said positive and negative rails to which said switch circuitry switches to when said switch circuitry is in the active state.

2. The amplifier/comparator of claim 1, wherein said amplifier/comparator circuitry has a common-mode range to one of said positive and negative rails corresponding to said one polarity and includes a pair of complementary transistors having respective conduction paths serially connected between said rails for conducting said current therebetween and having control electrodes coupled to respective ones of said input and reference terminals.

3. The amplifier/comparator of claim 1, wherein said amplifier/comparator circuitry comprises first and second transconductance square law devices, said devices having complementary conduction paths serially connected between said rails for conducting said current therebetween and having control electrodes coupled to respective ones of said input and reference terminals.

4. The amplifier/comparator of claim 1, wherein said switch circuitry comprises a transconductance switch element for being connected between said output node and the one of said positive or negative rails to which said switch circuitry switches to, said switch element activated by a voltage exceeding a predetermined threshold voltage inherent to said transconductance switch element for supplying an output current to said output node which varies in accordance with said square law relationship between said current conducted by said amplifier/comparator circuitry and said voltage difference between said input and reference terminals.

5. The amplifier/comparator of claim 4, wherein said switch control circuitry comprises a transresistance device disposed in said current path for sensing said current and outputting a voltage that is proportional to the square root of said current, said voltage controlling said transconductance switch element to supply said output current to said output node which varies in accordance with said square law relationship between said current conducted by said amplifier/comparator circuitry between said rails and said voltage difference between said input and output terminals.

6. A one way amplifier/comparator comprising:
a positive supply rail for being disposed at a positive voltage;
a negative supply rail for being disposed at a negative voltage;
an output terminal for being interfaced with a capacitive load;
an amplifier having an input terminal for receiving an input voltage and a reference terminal for being disposed at a reference voltage, said amplifier including a pair of complementary transistors having respective conduction paths serially connected between said rails for conducting a current between said positive and negative rails that varies in a square law relationship with the voltage difference between the input and reference voltages for one polarity thereof, said amplifier inhibiting current for the opposite polarity;

a current mirror amplifier having an input circuit connected in series with said conduction paths of said complementary transistors for sensing said amplifier current and having and an output circuit coupled between one of said rails and said output terminal for supplying an output current thereto having said square law relationship with said voltage difference of said one polarity; and a load disposed between said output terminal and the other of said positive or negative rails.

7. The amplifier/comparator of claim 6 wherein said amplifier has a common-mode range to the one of said positive and negative rails corresponding to said one polarity.

8. A one way amplifier/comparator, comprising:
a positive rail disposed at a positive voltage;
a negative rail disposed at a negative voltage;
an output nod having a capacitive load associated therewith;
an input terminal for receiving an input voltage;
a reference terminal for receiving a reference voltage;
amplifier/comparator circuitry for interfacing with said input and reference terminals to determine the voltage difference therebetween and sourcing a current from said positive rail to said negative rail that varies in a square law relationship with said voltage difference for one polarity thereof and inhibits current flow for the opposite polarity thereof;
switch circuitry having an active state with a low source impedance and an inactive and non-conducting state for selectively switching said output node to one of said positive or negative rails when in the active state;
switch control circuitry coupled to said amplifier/comparator circuitry for controlling said switch circuitry to switch from the inactive state to the active state when said current sourced by said amplifier/comparator exceeds a predetermined level; and
load circuitry for pulling said output node to the opposite of the one of said positive and negative rails to which said switch circuitry switches to when said switch circuitry is in the active state; and wherein said amplifier/comparator comprises:
a transconductance device having a P-channel transistor and an N-channel transistor arranged in a series configuration with the source thereof connected together, said P-channel and N-channel transistors operable to conduct current when the gates thereof are separated by approximately two threshold voltages with said transistors being connected in series between said positive and negative rails;
the gate of one of said transistors being connected to the input terminal and the gate of the other transistor being collected to an intermediate reference voltage wherein said one polarity is realized as a positive difference voltage between said input terminal and said intermediate reference voltage when the gate of said N-channel transistor is connected to the input voltage and the gate of said P-channel transistor is connected to said intermediate reference voltage, and said one polarity is realized as a negative difference voltage between said input terminal and said intermediate reference voltage when the gate of said P-channel transistor is connected to said input terminal and the gate of the N-channel transistor is connected to said intermediate reference voltage; and
means for generating said intermediate reference voltage such that said intermediate reference voltage varies from said reference voltage on said reference terminal by at least two threshold voltages, such that said intermediate voltage is two threshold voltages below the reference voltage when the input voltage terminal is connected to the gate of said N-channel transistor and said intermediate reference voltage is two threshold voltages above the reference voltage when said input terminal is connected to the gate of said P-channel transistor.

9. The amplifier/comparator of claim 8 and further comprising bootstrapping circuitry for bootstrapping said intermediate reference voltage with the voltage on said output terminal when the voltage on said output terminal changes in response to said switch element conducting.

10. The amplifier/comparator of claim 8 wherein said reference voltage circuitry comprises:
a current source disposed between said positive and negative rails; and
a transconductance device for being connected in series with said current source for generating said intermediate reference voltage at approximately two threshold voltages below the reference voltage when said polarity is positive and two threshold voltages above the reference voltage when said polarity is negative.

11. A fast one way amplifier comprising:
a positive rail for being disposed at a positive voltage;
a negative rail for being disposed at a negative voltage;
differential amplifier circuitry disposed between said positive and negative rail and having an input voltage terminal for receiving an input voltage and a reference voltage terminal for receiving a reference voltage, said differential amplifier circuitry including a pair of transistors having respective conduction paths serially connected between said rails for conducting a current therebetween that is proportional to the square of a differential voltage being present between the input and reference terminals for only one polarity of the differential voltage, said current being substantially zero for the opposite polarity of said differential voltage, said differential amplifier circuitry having a common mode range to the one of said positive and negative rails corresponding to said one polarity; and
output circuitry comprising a current mirror amplifier having an input circuit coupled in series with said conduction paths of said pair of transistors and an output circuit connected between an output terminal of said fast one way amplifier and one of said positive and negative rails for conducting an output current therebetween which varies in proportion to said square of said differential voltage of said one polarity.

12. The fast one way amplifier of claim 11 wherein said pair of transistors of said amplifier/comparator circuitry comprises a pair of complementary field effect transistors having commonly connected source electrodes, each field effect transistor having a drain electrode connected to a respective one of said rails.

13. A multivibrator comprising:
a positive supply rail connected to a positive supply voltage;
a negative supply rail connected to a negative supply voltage more negative than said positive supply;
a first comparator having a reference input and a signal input with said reference input connected to a predetermined positive reference voltage, said first comparator having an output for driving a capacitive load to one of said positive or negative rails with low source impedance, with a common mode range on the input to said positive rail, the output presenting a low impedance when the signal on said signal input is more positive than said positive reference voltage;
a second comparator having a reference input and a signal input with said reference input connected to a negative reference voltage, said second comparator having an output for driving a capacitive load to one of either said positive or negative rails with a low source impedance, with a common mode range to said negative rail, the output of said second comparator presenting a low source impedance when the voltage on said signal input is less than said negative reference voltage;
a set/reset flip flop having set and reset inputs connected to respective outputs of said first and second comparators, with an output having first and second states, the output of said set/reset flip flop changing from said first state to said second state when a low source impedance is presented on the output of said first comparator and from said second state to said first state when the output of said second comparator presents a low source impedance; and
integration circuitry for being connected between the output of said set/reset flip flop and said signal inputs on both said first and second comparators for integrating the transition on the output of said set/reset flip flop to alternately raise the input voltage above the positive reference voltage and below the negative reference voltage.

14. The multivibrator of claim 13 wherein said output of each of said first and second comparators is operable to drive the capacitive load associated therewith to said negative rail.

15. A method for providing one way amplification and comparison of input signal voltage, comprising:
providing a positive rail disposed at a positive voltage;
providing a negative rail disposed at a negative voltage;
receiving an input voltage on an input terminal;
receiving a reference voltage on a reference terminal;
determining the voltage difference between the input voltage and the reference voltage;
sourcing current in a circuit path extending from the positive rail to the negative rail that varies in a square law relationship with the voltage difference for one polarity thereof and inhibiting current flow in said circuit path for the opposite polarity thereof;
disposing a low source impedance switch between a capacitive output node and one of the positive or negative rails, the switch having an active state with a low source impedance and an inactive and nonconducting state;
controlling the switch to switch from the inactive state to the active state by sensing when the sourced current in said path having said square law relationship with said voltage difference for said one polarity exceeds a predetermined level; and
pulling the output node to the opposite of the positive and negative rails to which the switch drives the capacitive load when the switch is in the active state.

16. The method of claim 15 wherein the step of sourcing current comprises serially connecting a pair of complementary transconductance square law devices in said circuit path between the positive and negative rails.

17. The method of claim 16 wherein the step of disposing the switch between the capacitive node and the one of the positive and negative rails comprises disposing a transconductance switch element between the positive and negative rails and the step of sensing the sourced current from the transconductance square law devices in said circuit path comprises connecting a further transconductance square law deice in series with said complementary devices in said path and outputting a voltage that is proportional to the square root of the sensed current, the voltage controlling the transconductance switch element.

18. A method for comparing two input signals, comprising the step of:
providing first and second supply voltage source;
providing a pair of complementary transistors;
coupling the conduction paths of said complementary transistors in series between said supply voltage sources;
applying said two input signals to respective control electrodes of said pair of complementary transistors to cause a current to flow through said series connected conduction paths proportional to the square of the voltage difference between said signals when one signal is greater in a given sense than the other, said current being equal to zero otherwise; and
sensing said current and applying an output current to an output node in direct proportion to the magnitude of the sensed current whereby said output current is proportional to said square of said voltage difference between said two input signals when said one signal is greater in said given sense than said other signal.

19. A method as recited in claim 18 wherein the step of coupling said conduction paths of said transistors comprises connecting the source electrodes of a pair of complementary field-effect transistors in common and connecting the drain electrodes of said complementary field-effect transistors to respective ones of said supply voltage sources.

20. A method as recited in claim 18 wherein the step of sensing said current comprises providing a current mirror amplifier having input and output circuits, coupling said input circuit of said current mirror amplifier in series with said conduction paths of said complementary transistors, and coupling said output circuit between said output node and a selected one of said supply voltage sources.

21. Apparatus for comparing two input signals, comprising:

first and second supply voltage terminals;

a pair of complementary transistors having respective conduction paths connected in series between said terminals;

an input circuit for applying said input signals to respective control electrodes of said transistors for causing said transistors to conduct a current in said series connected conduction paths which varies as a square law function of a difference in voltage of said input signals when said difference is of a first polarity, said current being zero otherwise; and a current mirror amplifier having an input circuit connected in series with said series connected conduction paths of said complementary transistors and having an output circuit coupled between a selected one of said supply terminals and an output node for conducting an output current therebetween proportional to said square law function of said difference when said difference is of said first polarity, said output current being zero otherwise.

22. Apparatus as recited in claim 21 wherein said complementary transistors are field-effect transistors.

23. Apparatus as recited in claim 21 wherein said complementary transistors are field effect transistors having commonly connected source electrodes and having drain electrodes connected to respective ones of said supply terminals.

24. Apparatus s recited in claim 23 wherein said current mirror amplifier input circuit is connected between the drain electrode of one of said complementary field effect transistors and a selected one of said supply voltage terminals.

25. Apparatus as recited claim 24 wherein said current mirror amplifier is comprised of field-effect transistors.

* * * * *